(12) United States Patent
Ahn (10) Patent No.: US 11,069,607 B2
(45) Date of Patent: Jul. 20, 2021

(54) METAL OPTION STRUCTURE OF SEMICONDUCTOR DEVICE

(71) Applicant: SK hynix Inc., Icheon-si (KR)

(72) Inventor: Kyung Hun Ahn, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/876,012

(22) Filed: May 16, 2020

(65) Prior Publication Data

US 2021/0159165 A1    May 27, 2021

(30) Foreign Application Priority Data

Nov. 26, 2019 (KR) .................... 10-2019-0152944

(51) Int. Cl.
*H01L 23/522* (2006.01)
*H01L 23/528* (2006.01)

(52) U.S. Cl.
CPC ........ *H01L 23/5221* (2013.01); *H01L 23/528* (2013.01); *H01L 23/5226* (2013.01)

(58) Field of Classification Search
CPC ............. H01L 23/5221; H01L 23/5226; H01L 23/528
USPC ........................................................ 257/774
See application file for complete search history.

(56) References Cited

U.S. PATENT DOCUMENTS 7,111,149 B2 * 9/2006 Eilert ................. G11C 16/20
711/220

FOREIGN PATENT DOCUMENTS

| KR | 10-0238842 B1 | 1/2000 |
| KR | 10-2006-0005868 A | 1/2006 |
| KR | 10-2017-0050678 A | 5/2017 |

* cited by examiner

*Primary Examiner* — Tu-Tu V Ho (57) ABSTRACT

A metal option structure of a semiconductor device may include: a plurality of vias connecting first metal lines provided in a first metal layer to second metal lines provided in a second metal layer disposed over the first metal layer, and configured to constitute a plurality of nodes of an option circuit; and an identification pattern disposed between the first and second metal layers and having a different layout structure from the vias.

10 Claims, 13 Drawing Sheets

METAL OPTION STRUCTURE OF SEMICONDUCTOR DEVICE

CROSS-REFERENCE TO RELATED APPLICATION

The present application claims priority 35 U.S.C. § 119(a) to Korean Patent Application No. 10-2019-0152944, filed in the Korean Intellectual Property Office on Nov. 26, 2019, which is incorporated herein by reference in its entirety.

BACKGROUND

1. Technical Field

Various embodiments generally relate to a semiconductor technology, and more particularly, a metal option structure in a semiconductor device.

2. Related Art

In order to facilitate design, fabrication and test processes, various option circuits are configured in a semiconductor device, and the semiconductor device is designed to select and change a circuit by changing a metal option through mask repair. For example, in order to fabricate x8 products and x16 products together on the same fabrication line, the x16 products are first fabricated on the fabrication line. Then, when the x8 products are fabricated, the metal option is changed through mask repair process to implement the 8x structure.

SUMMARY

Various embodiments are directed to a semiconductor device with a metal option structure, which can reduce a fail which may occur during a mask repair process for changing a metal option, and contribute to improve repair efficiency.

In an embodiment, a metal option structure of a semiconductor device may include: a plurality of vias connecting first metal lines provided in a first metal layer to second metal lines provided in a second metal layer disposed over the first metal layer, and configured to constitute a plurality of nodes of an option circuit; and an identification pattern disposed between the first and second metal layers and having a different layout structure from the vias.

DETAILED DESCRIPTION

The advantages and characteristics of the present invention and methods for achieving these advantages and characteristics will be clearly described through the following embodiments with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise.

Elements in embodiments of the disclosure should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used. When a positional relationship is described, for example, when a positional relationship between two components, such as 'on', 'over', 'under' or 'beside' is described, one or more other components may be located between two components, as long as a term such as 'directly' or 'immediately' is not used.

Also, elements in embodiments of the disclosure are not limited by these terms. These terms are used to merely distinguish one element from another. Accordingly, as used herein, a first element may be a second element within the technical idea of the disclosure.

Also, features of various exemplary embodiments of the disclosure may be coupled, combined or separated partially or totally. Technically various interactions and operations are possible. Various exemplary embodiments can be practiced individually or in combination.

Hereinafter, exemplary embodiments will be described in detail with reference to the accompanying drawings. In the accompanying drawings, two directions that are substantially parallel to the top surface of a substrate and intersect with each other are defined as a first direction FD and a second direction SD, respectively, and a direction that vertically protrudes from the top surface of the substrate is defined as a vertical direction. The first direction FD and the second direction SD may substantially perpendicularly intersect with each other to form a plane substantially parallel to the top surface of the substrate. The vertical direction may correspond to a direction that is perpendicular to the first direction FD and the second direction SD. In the drawings, a direction indicated by an arrow and a direction opposite thereto represent the same direction.

Figure 1:
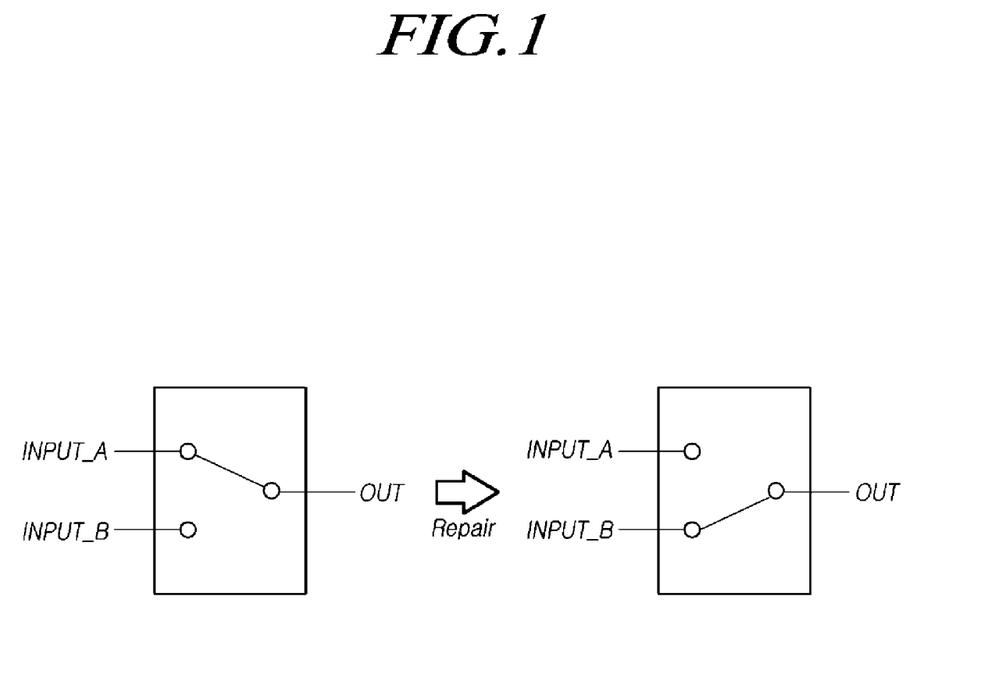
FIG. 1 is a circuit diagram illustrating a metal option structure of a semiconductor device in accordance with an embodiment of the disclosure.
Figure 2:
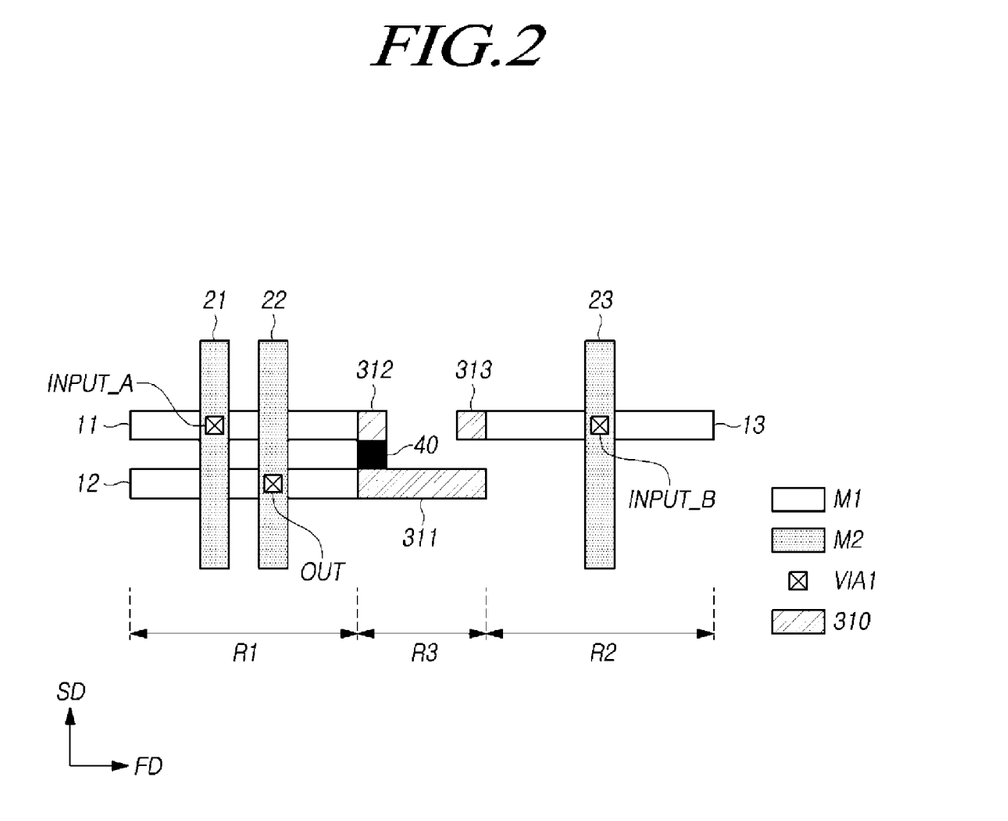
FIG. 2 is a layout diagram illustrating an embodiment of the metal option structure of FIG. 1, before the metal option structure is repaired.
Figure 3:
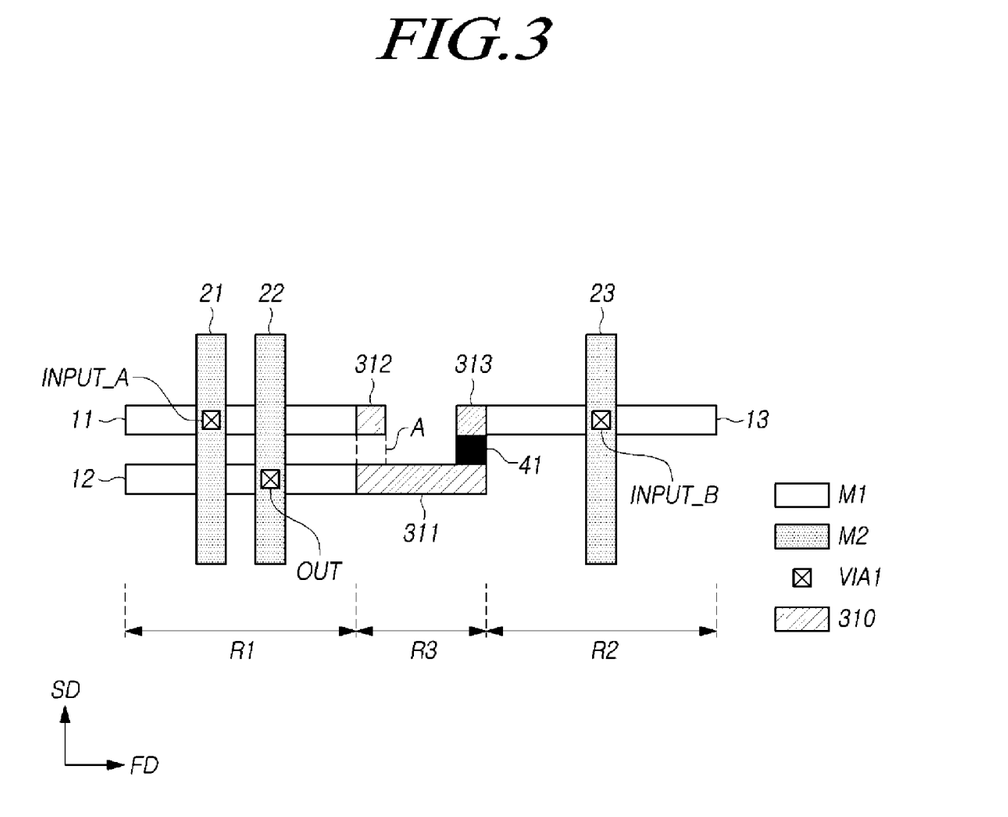
FIG. 3 is a layout diagram illustrating the metal option structure of FIG. 2 after the metal option structure is repaired.

FIG. 1 is a circuit diagram illustrating a metal option structure of a semiconductor device in accordance with an embodiment of the disclosure. FIG. 2 is a layout diagram illustrating an embodiment of the metal option structure of FIG. 1, before the metal option structure is repaired. FIG. 3 is a layout diagram illustrating the metal option structure of FIG. 2 after the metal option structure is repaired.

Referring to FIGS. 1 to 3, a metal option structure may include a plurality of first metal lines 11 to 13 provided in a first metal layer M1; a plurality of second metal lines 21 to 23 provided in a second metal layer M2; and a plurality of vias VIA1. The plurality of vias VIA1 may extend in a vertical direction, and connect the first metal lines 11 to 13 and the second metal lines 21 to 23. The plurality of vias VIA1 may constitute nodes INPUT_A, INPUT_B and OUT of an option circuit. The first metal layer M1 may be a metal layer which is disposed at a lower level, in the vertical direction, than the second metal layer M2. The first metal layer M1 and the second metal layer M2 may be located adjacent to each other in the vertical direction.

An option region may include a first region R1 and a second region R2 disposed in a first direction FD, and a third region R3 disposed between the first region R1 and the second region R2. The first metal lines 11 to 13, the second metal lines 21 to 23, and the vias VIA1 may be disposed in the first and second regions R1 and R2. The first and second metal lines 11 to 13 and 21 to 23 and the vias VIA1 may not be disposed in the third region R3. The first metal lines 11 to 13 extend in the first direction, and may have ends disposed adjacent to one another. The first metal lines 11 to 13 may have an end that terminates at or around the boundary between the first region R1 and the third region R3, or around the boundary between the second region R2 and the third region R3.

The first metal lines 11 to 13 may be extended in the first direction FD. From a top view in a vertical direction, the second metal lines 21 to 23 may extend in the second direction SD and intersect or cross the first metal lines 11 to 13. The input node INPUT_A may be disposed at an intersection between the first metal line 11 and the second metal line 21, and may connect the first and second metal lines 11 and 21. The input node INPUT_B may be disposed at an intersection between the first metal line 13 and the second metal line 23, and connect the first and second metal lines 13 and 23. The output node OUT may be disposed at an intersection between the first metal line 12 and the second metal line 22, and connect the first and second metal lines 12 and 22.

An identification pattern 310 having a different layout structure from the vias VIA1 may be provided. The identification pattern 310 may extend vertically from the first metal layer M1 to the second metal layer M2. The identification pattern 310 may be utilized as a guide for identifying the nodes INPUT_A, INPUT_B and OUT of the option circuit during a mask repair process for changing or repairing the metal option. Nodes INPUT_A, INPUT_B and OUT of the option circuit have the same or substantially the same or similar structure and are all disposed in the metal option region. Therefore, it may be difficult to identify the positions of the nodes INPUT_A, INPUT_B and OUT of the option circuit during the mask repair process for changing the metal option. If the mask repair process is performed while the positions of the nodes INPUT_A, INPUT_B and OUT of the option circuit are not identified, then a short fail or open fail may occur, which degrades repair efficiency. The identification pattern 310, which can be utilized for identifying the nodes INPUT_A, INPUT_B and OUT of the option circuit, may be provided to suppress a fail which may occur during the mask repair process for changing the metal option.

The identification pattern 310 may be configured as a combination of a plurality of via patterns 311 to 313. In an embodiment, the via patterns 311 to 313 constituting the identification pattern 310 may be disposed in the third region R3, and may be connected to respective ends of the first metal lines 11 to 13 at or near the boundaries of third region R3. As illustrated in FIGS. 2 and 3, the via patterns 311 to 313 constituting the identification pattern 310 may include a line-type via pattern 311 and dot-type via patterns 312 and 313. The shape of the identification pattern 310 is not limited such line-type and dot-type patterns and may be changed or selected to facilitate identification or patterning processes.

FIG. 2 illustrates an example in which the metal option is set or configured to connect the output node OUT and the input node INPUT_A. Referring to FIG. 2, an option via 40 may extend in vertical direction from the first metal layer M1 to the second metal layers M2. The option via 40 may connect the via pattern 311, which is connected to the output node OUT through the first metal line 12, and the via pattern 312, which is connected to the input node INPUT_A through the first metal line 11. Thus, a routing path connecting the output node OUT and the input node INPUT_A may be configured. In this case, the via patterns 311 and 312 included in the identification pattern 310 may be included in the routing path connecting the output node OUT and the input node INPUT_A.

Referring back to FIGS. 1 and 3, the metal option may be changed through a mask repair process, after the routing path of FIG. 2 is configured, in order to connect the output node OUT to the input node INPUT_B. During the mask repair process for changing the metal option, the identification pattern 310 may be utilized as a guide for identifying the nodes INPUT_A, INPUT_B and OUT in the option circuit. That is, the positions of the nodes INPUT_A, INPUT_B and OUT of the option circuit may be identified and located based on the identification pattern 310. Then, using the identified position information, the option via 40 of FIG. 2 may be removed (as indicated by A in FIG. 3) in order to disconnect the output node OUT from the input node INPUT_A. Then, an option via 41 may be disposed between the via pattern 311, which is connected to the output node OUT through the first metal line 12, and the via pattern 313, which is connected to the input node INPUT_B through the first metal line 13. After the repair, option via 41 may connect the via patterns 311 and 313 to constitute a routing path which connects the output node OUT and the input node INPUT_B.

Figure 4:
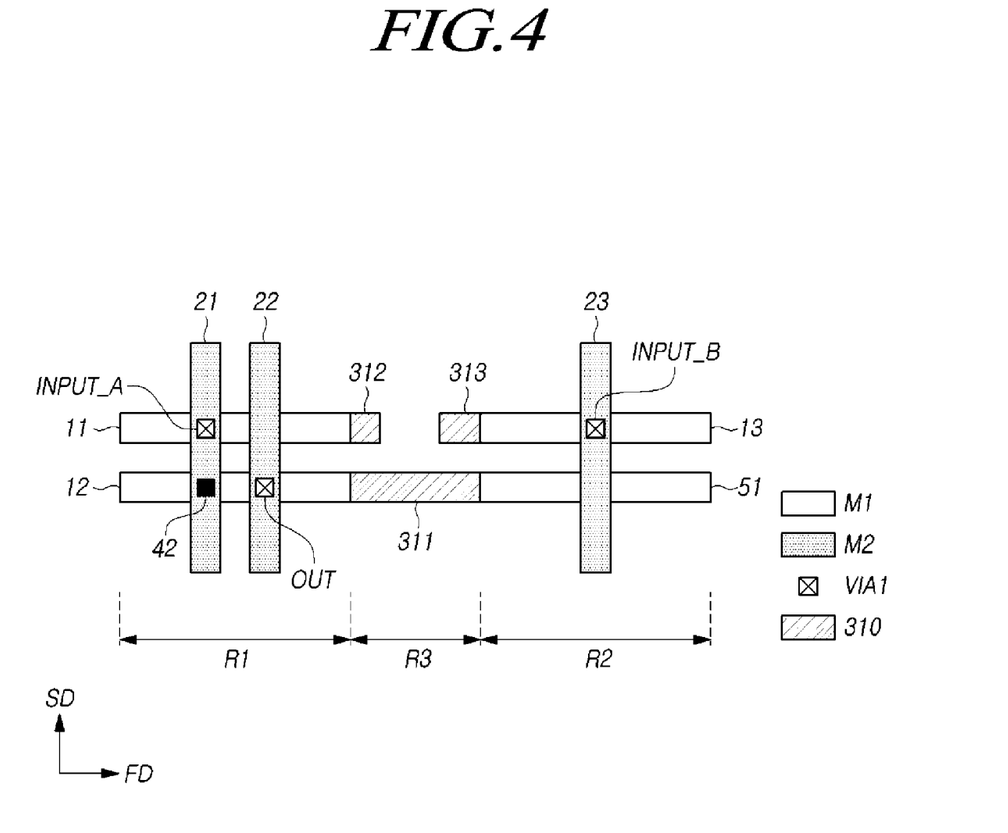
FIG. 4 is a layout diagram illustrating an embodiment of the metal option structure of FIG. 1, before the metal option structure is repaired.
Figure 5:
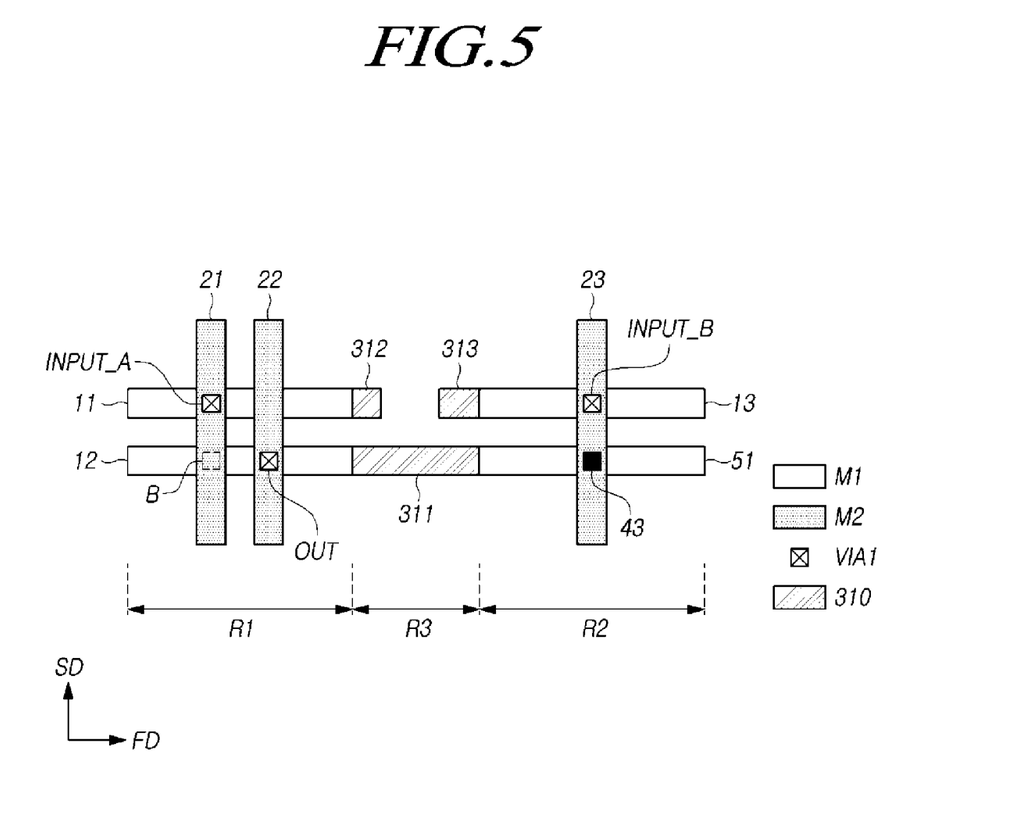
FIG. 5 is a layout diagram illustrating the metal option structure of FIG. 4 after the metal option structure is repaired.

FIG. 4 is a layout diagram illustrating an embodiment of the metal option structure of FIG. 1, before the metal option structure is repaired. FIG. 5 is a layout diagram illustrating the metal option structure of FIG. 4 after the metal option structure is repaired.

Referring to FIGS. 4 and 5, a coupling line 51, which is not directly connected to the nodes INPUT_A, INPUT_B and OUT of the option circuit, may be provided in the first metal layer M1. The coupling line 51 may extend in the first direction and may be connected to the first metal line 12 through the via pattern 311, which is part of the identification pattern 310. The via pattern 311 may serve as a bridge connecting the first metal line 12 and the coupling line 51. The via pattern 311 may be defined as a bridge-type via pattern.

FIG. 4 illustrates an embodiment in which the metal option is set or configured to connect the output node OUT and the input node INPUT_A. Referring to FIG. 4, an option via 42 may be disposed at the intersection between the first metal line 12 and the second metal line 21. Option via 41 may extend in the vertical direction and connect the first and second metal lines 12 and 21. Thus, a routing path connecting the output node OUT and the input node INPUT_A may be configured.

Referring back to FIGS. 1 and 5, the metal option may be changed or reconfigured through a mask repair process, after the routing path of FIG. 4 is configured, in order to connect the output node OUT and the input node INPUT_B. During the mask repair process for changing the metal option, the identification pattern 310 may be used as a guide for identifying the nodes INPUT_A, INPUT_B and OUT of the option circuit. That is, the positions of the nodes INPUT_A, INPUT_B and OUT of the option circuit may be identified and located using the identification pattern 310. Then, based on the identified position information, the option via 42 of FIG. 4 may be removed (as indicated by B in FIG. 5) in order to disconnect the output node OUT from the input node INPUT_A. An option via 43 may be disposed at the intersection between the coupling line 51 and the second metal line 23. Option via 43 may connect the coupling line 51 and the second metal line 23, which are included in a routing path that connects the output node OUT and the input node INPUT_B.

In the embodiments described with reference to FIGS. 1 to 5, a metal option structure has been described with two input nodes INPUT_A and INPUT_B and one output node OUT. However, the metal option structure may be different or changed in various manners depending on the shape, complexity, configuration, nature, etc. of the option circuit. Hereafter, embodiments having a metal option structure including three input nodes and one output node will be described with reference to FIGS. 6 to 10, however it will be understood that the present disclosure is not limited to the numbers of input nodes and output nodes described herein. Any number of input nodes and output nodes are contemplated by the disclosure through the implementation of different features of the disclosed identification patterns.

Figure 6:
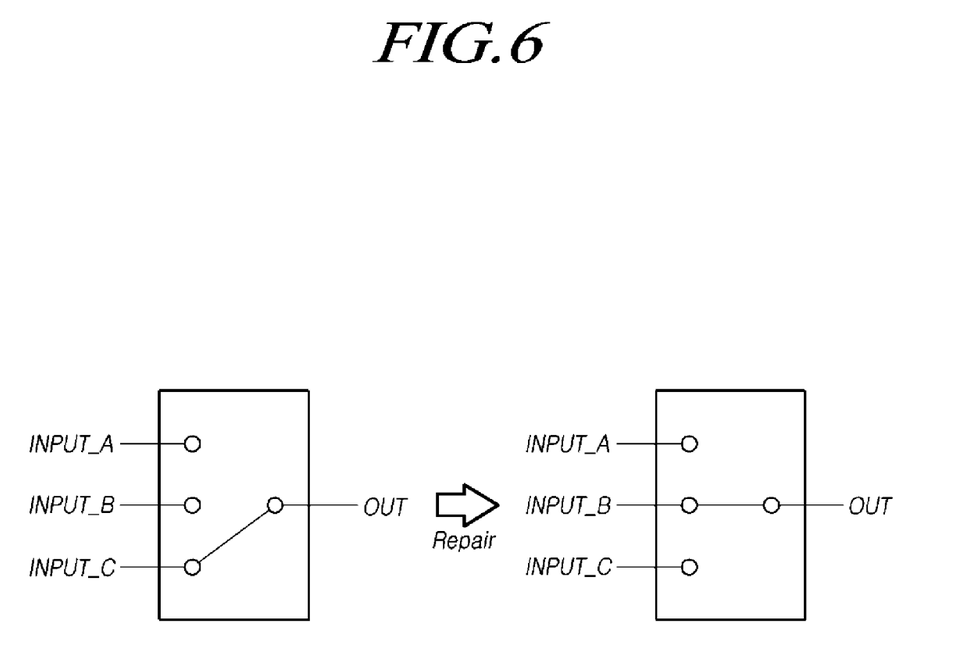
FIG. 6 is a circuit diagram illustrating a metal option structure of a semiconductor device in accordance with an embodiment of the disclosure.
Figure 7:
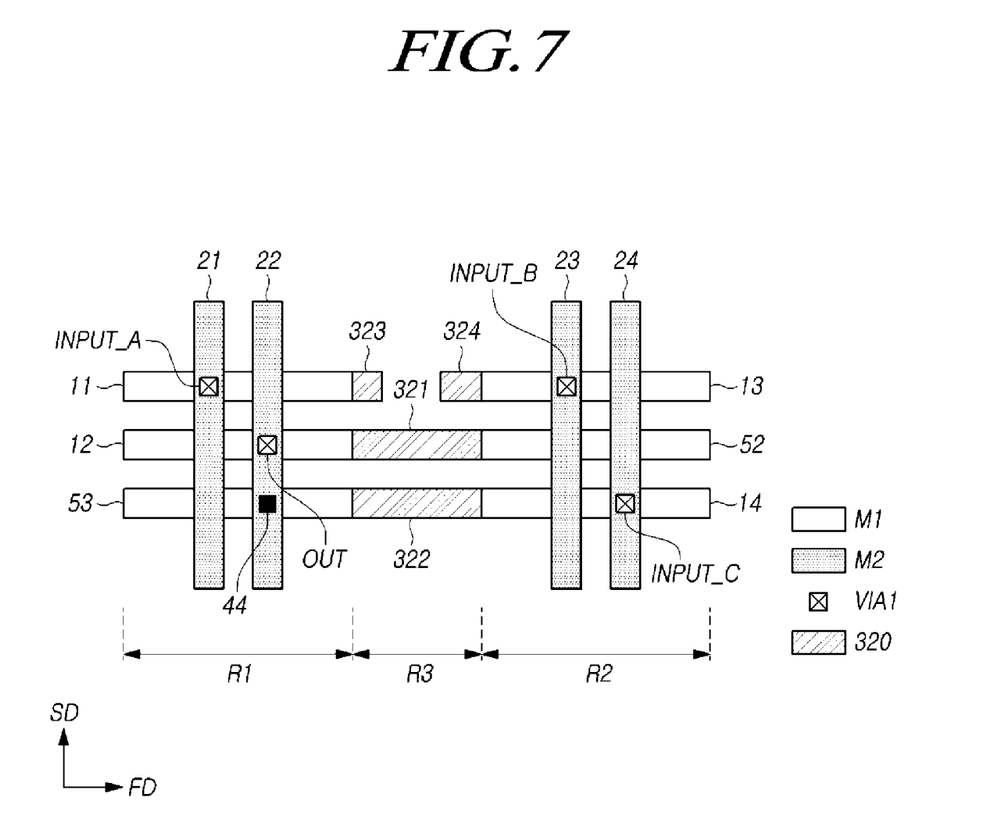
FIG. 7 is a layout diagram illustrating an embodiment of the metal option structure of FIG. 6, before the metal option structure is repaired.
Figure 8:
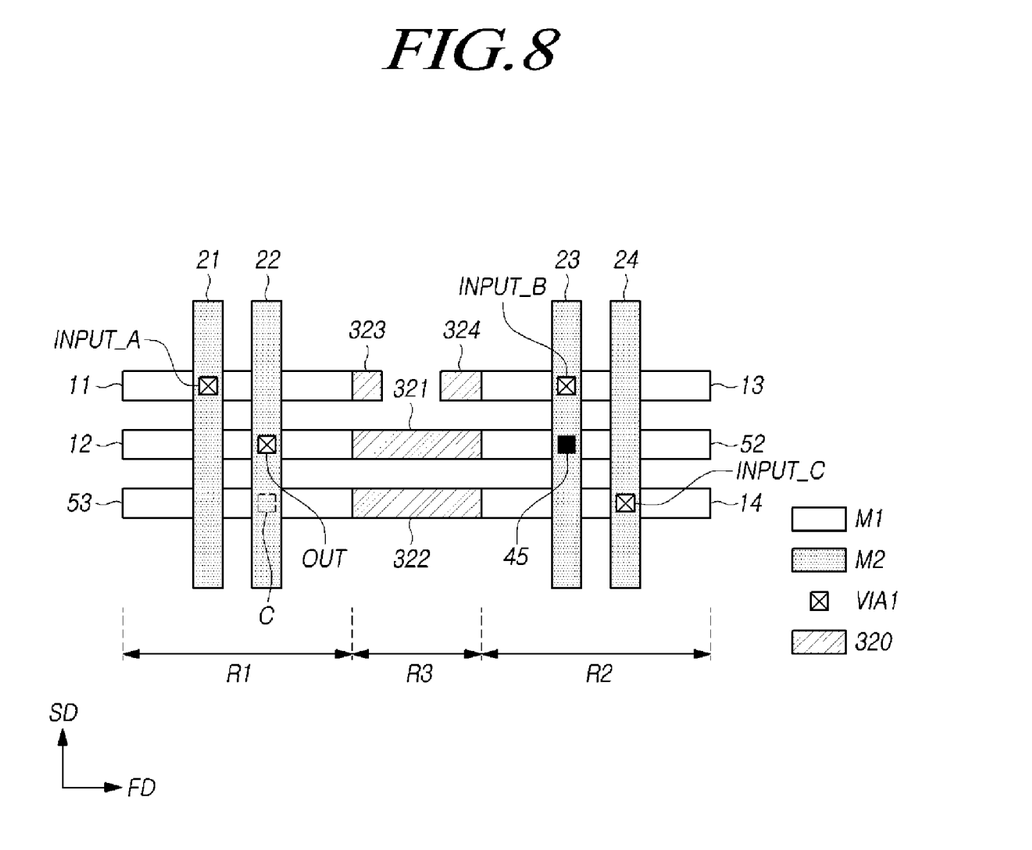
FIG. 8 is a layout diagram illustrating the metal option structure of FIG. 7 after the metal option structure is repaired.

FIG. 6 is a circuit diagram illustrating a metal option structure of a semiconductor device in accordance with an embodiment of the disclosure. FIG. 7 is a layout diagram illustrating an embodiment of the metal option structure of FIG. 6, before the metal option structure is repaired. FIG. 8 is a layout diagram illustrating the metal option structure of FIG. 7 after the metal option structure is repaired.

Referring to FIGS. 6 to 8, a metal option structure may include three input nodes INPUT_A, INPUT_B and INPUT_C and one output node OUT. Vias VIA1 may extend in the vertical direction from a first metal layer M1 to a second metal layer M2. The Vias VIA1 may constitute the input nodes INPUT_A, INPUT_B and INPUT_C and output node OUT of an option circuit.

A plurality of first metal lines 11 to 14 extending in the first direction may be provided in the first metal layer M1, and may be connected to different vias VIA1. A plurality of second metal lines 21 to 24 extending in the second direction may be provided in the second metal layer M2, and may be connected to the respective vias VIA1. Coupling lines 52 and 53 extending in the first direction, which may be provided in the first metal layer M1, are not directly connected to the vias VIA1.

Referring back to FIG. 7, the first and second metal lines 11 to 14 and 21 to 24, the coupling lines 52 and 53 and the nodes INPUT_A, INPUT_B, INPUT_C and OUT may be disposed in first and second regions R1 and R2. In a third region R3, the first and second metal lines 11 to 14 and 21 to 24, the coupling lines 52 and 53 and the nodes INPUT_A, INPUT_B, INPUT_C and OUT may not be disposed. The first metal lines 11 to 14 may have ends or end parts disposed adjacent to one another. For example, first metal lines 11 and 12 may have an end that terminates at or around the boundary between the first region R1 and the third region R3, and first metal lines 13 and 14 may have end parts that terminate at or around the boundary between the second region R2 and the third region R3.

The first metal lines 11 to 14 and the coupling lines 52 and 53 may be extended in a first direction FD. From a top view looking in a vertical direction, the second metal lines 21 to 24 may intersect or cross the first metal lines 11 to 14 and the coupling lines 52 and 53 while extended in a second direction SD. The input node INPUT_A may be disposed at an intersection between the first metal line 11 and the second metal line 21, and may connect the first and second metal lines 11 and 21. The input node INPUT_B may be disposed at an intersection between the first metal line 13 and the second metal line 23, extending between the first metal line 13 and the second metal line 23 in a vertical direction, and may connect the first and second metal lines 13 and 23. The input node INPUT_C may be disposed at an intersection between the first metal line 14 and the second metal line 24, extending between the first metal line 14 and the second metal line 24 in a vertical direction, and may connect the first and second metal lines 14 and 24. The output node OUT may be disposed at an intersection between the first metal line 12 and the second metal line 22, extending between the first metal line 12 and the second metal line 22 in a vertical direction, and may connect the first and second metal lines 12 and 22.

An identification pattern 320 having a different layout structure from the vias VIA1 may be provided. The identification pattern 310 may extend vertically from the first metal layer M1 to the second metal layer M2. The identification pattern 320 may be utilized as a guide for identifying the nodes INPUT_A, INPUT_B, INPUT_C and OUT of the option circuit during a mask repair process for changing or repairing the metal option.

The identification pattern 320 may be configured as a combination of a plurality of via patterns 321 to 324. In an embodiment, the via patterns 321 to 324 constituting an identification pattern 320 may be disposed in the third region R3, and may be connected to the respective end parts of the first metal lines 11 to 14 of the metal layer M1. As illustrated in FIGS. 7 and 8, the via patterns 321 to 324 constituting the identification pattern 320 may include line-type via patterns 321 and 322 and dot-type via patterns 323 and 324. The shape of the identification pattern 320 is not limited such line-type and dot-type patterns and may be changed or selected to facilitate identification or patterning processes.

The coupling line 52 may be connected to the first metal line 12 through the via pattern 321, and the coupling line 53 may be connected to the first metal line 14 through the via pattern 322. The via pattern 321 may serve as a bridge connecting the first metal line 12 and the coupling line 52, and the via pattern 322 may serve as a bridge connecting the first metal line 14 and the coupling line 53.

FIG. 7 illustrates an embodiment in which the metal option is set or configured to connect the output node OUT and the input node INPUT_C. Referring to FIG. 7, an option via 44 may be disposed or formed at the intersection between the second metal line 22 and the coupling line 53, and may connect the second metal line 22 and the coupling line 53. Thus, a routing path connecting the output node OUT and the input node INPUT_C may be configured.

Referring back to FIGS. 6 and 8, the metal option may be changed through the mask repair process, after the routing path of FIG. 7 is configured, in order to connect the output node OUT and the input node INPUT_B. During the mask repair process, the identification pattern 320 may be utilized as a guide for identifying the nodes INPUT_A, INPUT_B, INPUT_C and OUT in the option circuit. That is, the positions of the nodes INPUT_A, INPUT_B, INPUT_C and OUT of the option circuit may be identified and located based on the identification pattern 320. Then, using the identified position information, the option via 44 of FIG. 7 may be removed (as indicated by C in FIG. 8)) in order to disconnect the output node OUT from the input node INPUT_C. An option via 45 may be disposed at the intersection between the coupling line 52 and the second metal line 23. Option via 45 may connect the coupling line 52 and the second metal line 23 and may be included in a routing path that connects the output node OUT and the input node INPUT_B.

Figure 9:
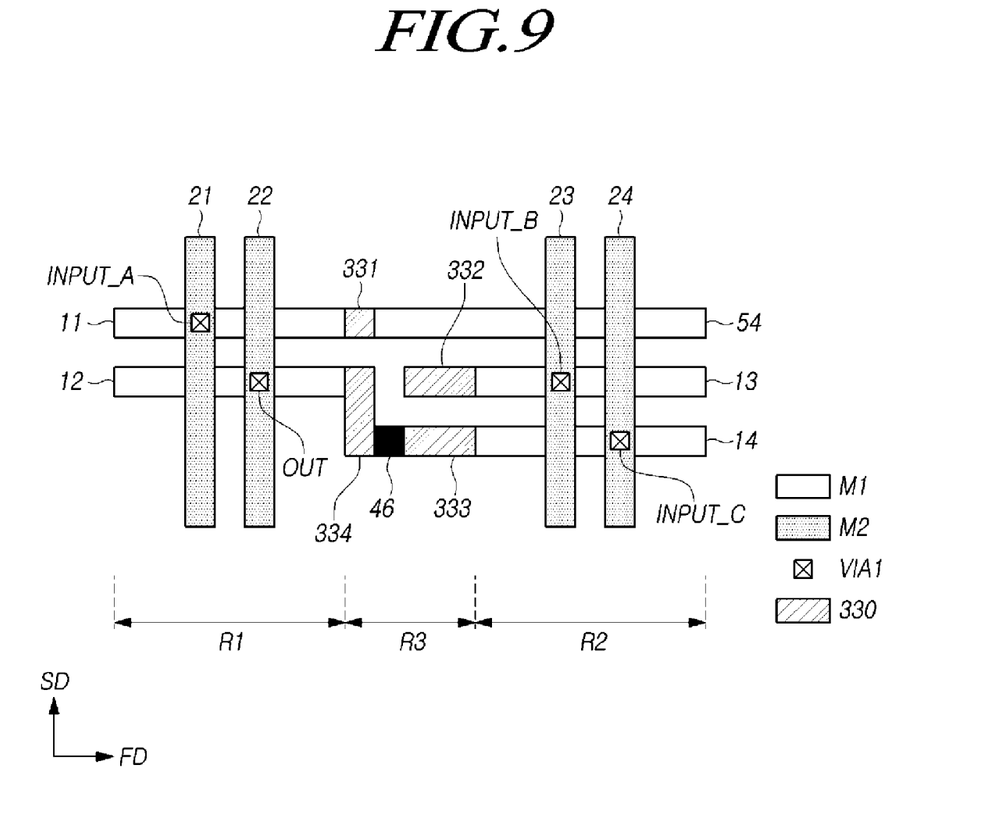
FIG. 9 is a layout diagram illustrating an embodiment of the metal option structure of FIG. 6, before the metal option structure is repaired.
Figure 10:
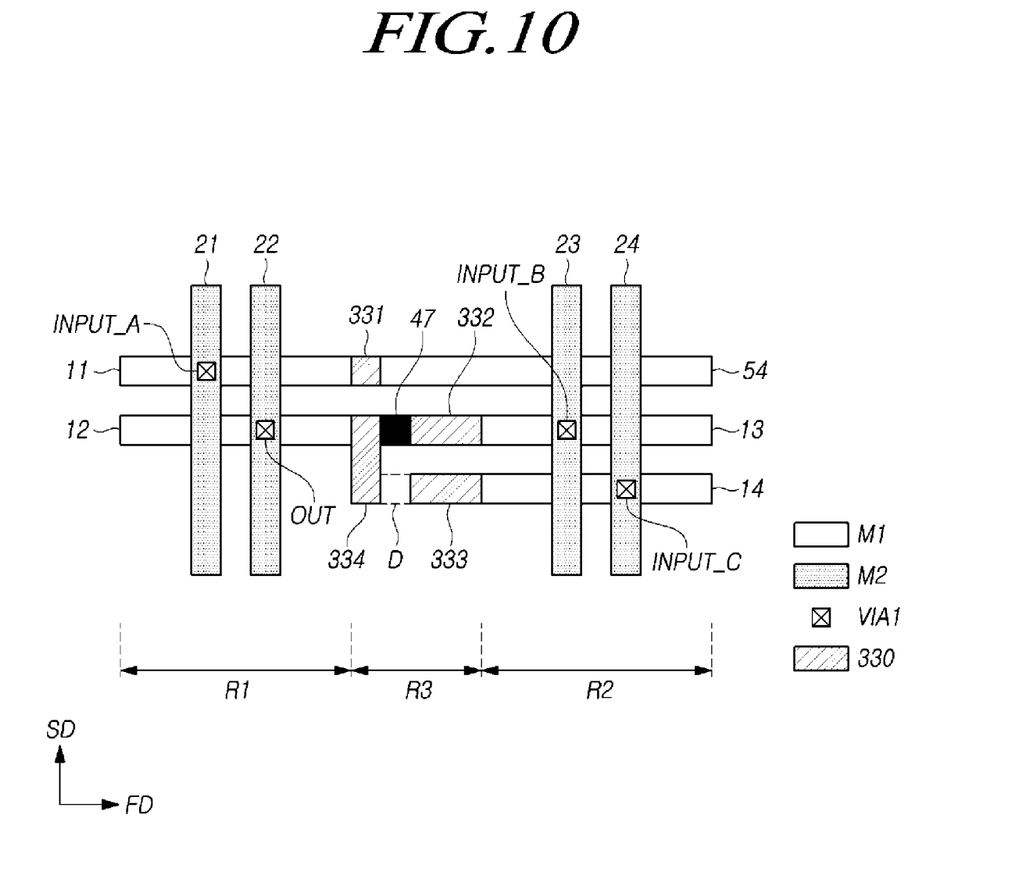
FIG. 10 is a layout diagram illustrating the metal option structure of FIG. 9 after the metal option structure is repaired.

FIG. 9 is a layout diagram illustrating an embodiment of the metal option structure of FIG. 6, before the metal option structure is repaired. FIG. 10 is a layout diagram illustrating the metal option structure of FIG. 9 after the metal option structure is repaired.

Referring to FIGS. 9 and 10, vias VIA1 may extend in the vertical direction from a first metal layer M1 to a second metal layer M2. The vias VIA1 may constitute nodes INPUT_A, INPUT_B, INPUT_C and OUT of an option circuit. A plurality of first metal lines 11 to 14 may be provided in the first metal layer M1 and may be connected to respective vias VIA1. A plurality of second metal lines 21 to 24 may be provided in the second metal layer M2 and may be connected to respective vias VIA1. A coupling line 54 may be provided in the first metal layer M1 and is not directly connected to the vias VIA1.

The first metal lines 11 to 14 and the coupling line 54 may be extended in a first direction FD. From a top view, the second metal lines 21 to 24 may intersect or cross the first metal lines 11 to 14 and the coupling line 54 while extended in a second direction SD.

The input node INPUT_A may be disposed at an intersection between the first metal line 11 and the second metal line 21, and may connect the first and second metal lines 11 and 21. The input node INPUT_B may be disposed at an intersection between the first metal line 13 and the second metal line 23, and may connect the first and second metal lines 13 and 23. The input node INPUT_C may be disposed at an intersection between the first metal line 14 and the second metal line 24, and may connect the first and second metal lines 14 and 24. The output node OUT may be disposed at an intersection between the first and second metal lines 12 and 22, and may connect the first and second metal lines 12 and 22.

Between the first and second metal layers M1 and M2, an identification pattern 330 having a different layout structure from the vias VIA1 may be provided. The identification pattern 330 may be used as a guide for identifying the nodes INPUT_A, INPUT_B, INPUT_C and OUT of the option circuit during the mask repair process for changing or repairing the metal option.

The identification pattern 330 may include a plurality of via patterns 331 to 334. In an embodiment, the via patterns 331 to 334 constituting the identification pattern 330 may be connected to ends or end parts of the first metal lines 11 to 14. The coupling line 54 may be connected to the first metal line 11 through the via pattern 331.

FIG. 9 illustrates an embodiment in which the metal option is set or configured to connect the output node OUT and the input node INPUT_C. Referring to FIG. 9, an option via 46 may be disposed or formed between the via pattern 334, which extends in the second direction and is connected to the output node OUT through the first metal line 12, to the via pattern 333, which is connected to the input node INPUT_C through the first metal line 14. Option via 46 may connect the via pattern 334 and the via pattern 333. Thus, a routing path connecting the output node OUT and the input node INPUT_C may be configured.

Referring back to FIGS. 6 and 10, the disclosed metal options may be changed or reconfigured through the mask repair process, after the routing path of FIG. 9 is configured, in order to connect the output node OUT and the input node INPUT_B. During the mask repair process, the identification pattern 330 may be utilized as a guide for identifying the nodes INPUT_A, INPUT_B, INPUT_C and OUT in the option circuit. That is, the positions of the nodes INPUT_A, INPUT_B, INPUT_C and OUT of the option circuit may be identified based on the identification pattern 330.

Then, using the identified position information, the option via 46 of FIG. 9 may be removed (as indicated by D in FIG. 10) in order to disconnect the output node OUT from the input node INPUT_C. An option via 47 may be disposed between the via pattern 334, which is connected to the output node OUT through the first metal line 12, and the via pattern 332, which is connected to the input node INPUT_B through the first metal line 13. Option via 47 and the via patterns 334 and 332 may be included in a routing path that connects the output node OUT and the input node INPUT_B.

In the embodiments described herein with reference to FIGS. 1 to 10, an identification pattern may be configured as a combination of via patterns connected to the end parts of the first metal lines, but the embodiments contemplated by the disclosure are not limited thereto. For example, FIG. 11 illustrates another embodiment of an identification pattern.

Figure 11:
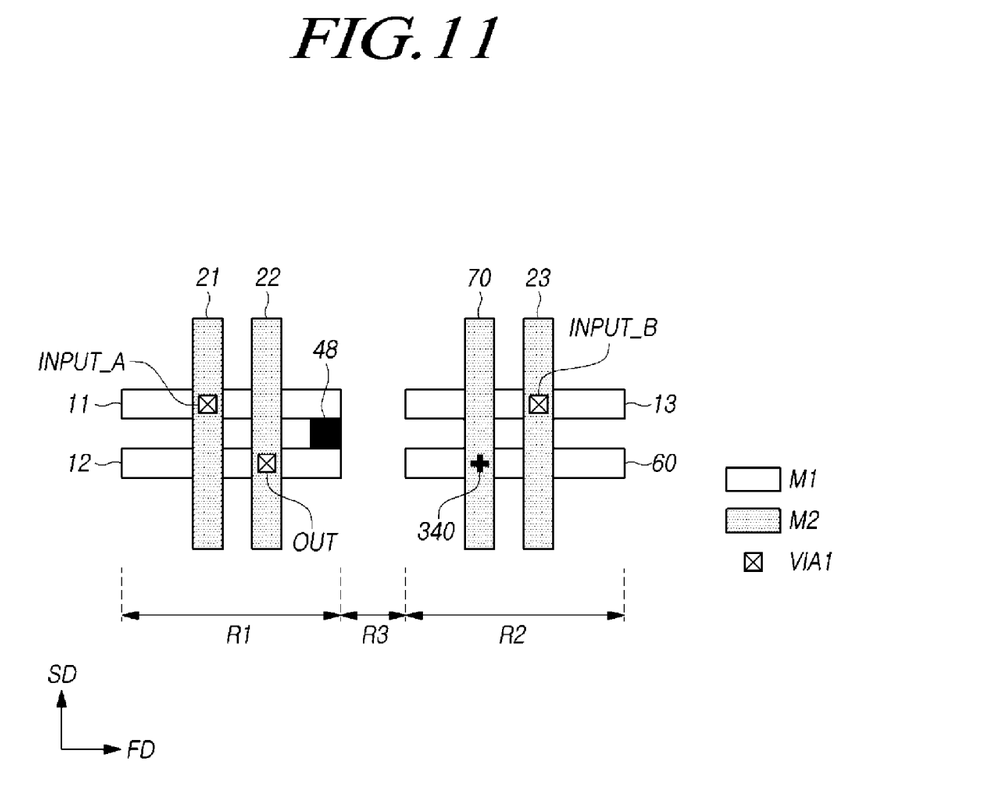
FIG. 11 is a layout diagram illustrating a metal option structure of a semiconductor device in accordance with an embodiment of the disclosure.

Referring to FIG. 11, a metal option is set to connect the output node OUT and the input node INPUT_A. Specifically, an option via 48 may be disposed between the first metal line 11, which is connected to the input node INPUT_A, and the first metal line 12, which is connected to the output node OUT, and may connect the first metal line 11 and the first metal line 12. Thus, a routing path connecting the output node OUT and the input node INPUT_A may be configured.

Between the first and second metal layers M1 and M2, an identification pattern 340 having a different layout or cross-sectional structure from the vias VIA1 may be provided. For example, the vias VIA1 may have a rectangular layout structure or cross-sectional shape, and the identification pattern 340 may have a cross-shaped layout structure.

A first dummy metal line 60 may be disposed in the first metal layer M1, and a second dummy metal line 70 may be disposed in the second metal layer M2. The first dummy metal line 60 may be disposed in parallel or substantially in parallel to the first metal lines 11 to 13 extending in the first direction, and may not be connected to the first metal lines 11 to 13. The second dummy metal line 70 may be disposed in parallel or substantially in parallel to the second metal lines 21 to 23 extending in the second direction, and may not be connected to the second metal lines 21 to 23. The first dummy metal line 60 and the second dummy metal line 70 may intersect or cross each other in a top view, and the identification pattern 340 may be disposed, extending in a vertical, at the intersection between the first dummy metal line 60 and the second dummy metal line 70. The identification pattern 340, in accordance with the present embodiment, may be electrically separated from the first metal lines 11 to 13, the second metal lines 21 to 23, and the vias VIA1.

Embodiments disclosed herein describe identification patterns for identifying the nodes of an option circuit. Therefore, during a mask repair process for changing a metal option, a reference pattern for identifying the nodes of the option circuit can be provided to accurately identify the positions of the nodes, which makes it possible to not only reduce fails which may occur during a repair process, but also improve repair efficiency.

The above-described semiconductor devices may be used in different electronic systems and package modules.

Figure 12:
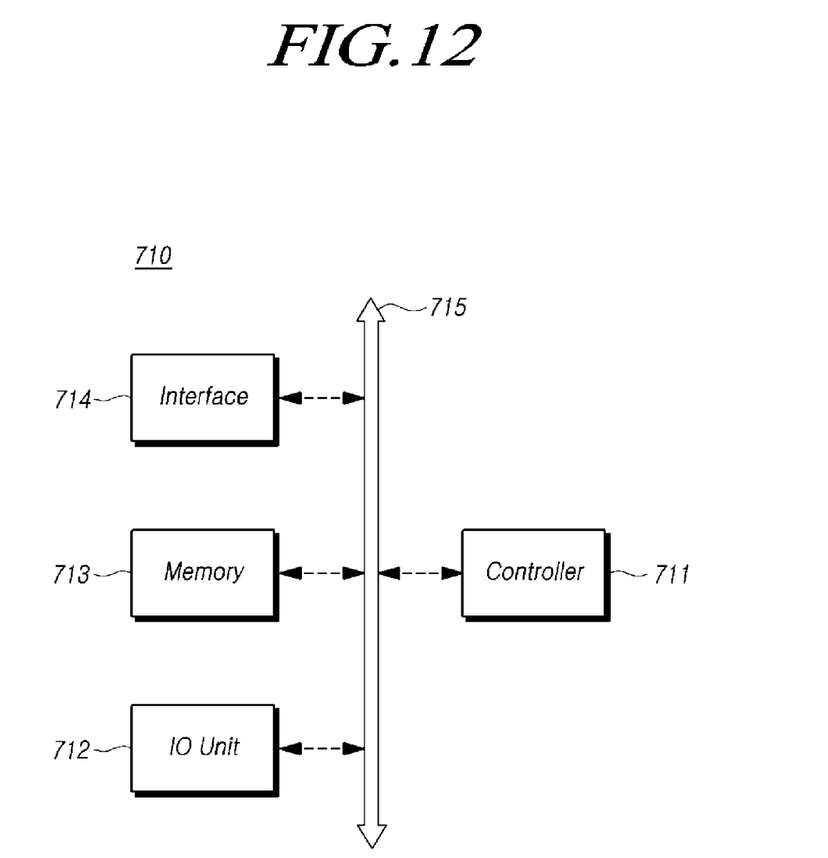
FIG. 12 is a block diagram illustrating an electronic system having a semiconductor device in accordance with an embodiment of the disclosure.
Figure 13:
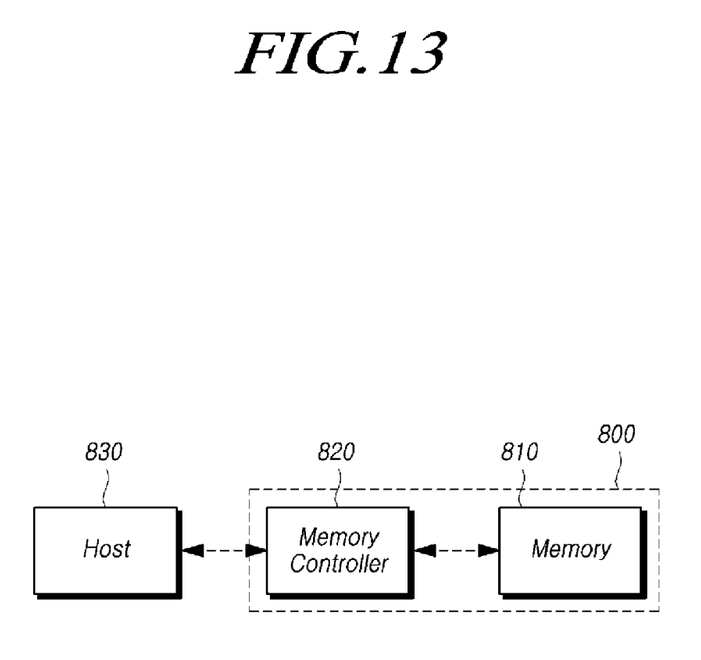
FIG. 13 is a block diagram illustrating a memory card including a semiconductor device in accordance with an embodiment of the disclosure.

FIG. 12 is a block diagram illustrating an electronic system having a semiconductor device in accordance with an embodiment of the disclosure. FIG. 13 is a block diagram illustrating a memory card including a semiconductor device in accordance with an embodiment of the disclosure.

Referring to FIG. 12, the semiconductor devices in accordance with embodiments disclosed herein may be applied to an electronic system 710. The electronic system 710 may include a controller 711, an input/output unit 712, and a memory 713. The controller 711, the input/output unit 712 and the memory 713 may be electrically coupled with one another through a bus 715, which provides a data movement path.

For example, the controller 711 may include at least one microprocessor, at least one digital signal processor, at least one microcontroller, and at least one of logic circuits capable of performing the same functions as these components. The memory 713 may include at least one of a semiconductor device in accordance with disclosed embodiments. The input/output unit 712 may include at least one selected among a keypad, a keyboard, a display device, a touch screen, and so forth. The memory 713, as a device for storing data, may store data or/and commands to be executed by the controller 711 or the like.

The memory 713 may include a volatile memory device such as a DRAM or/and a nonvolatile memory device such as a flash memory. For example, the flash memory may be mounted to a mobile terminal or an information processing system such as a desktop computer. The flash memory may be configured by an SSD (solid state drive). In this case, the electronic system 710 may stably store a large amount of data in a flash memory system.

The electronic system 710 may further include an interface 714 which is set to be able to transmit and receive data to and from a communication network. The interface 714 may be a wired or wireless type. For example, the interface 714 may include an antenna, a wired transceiver or a wireless transceiver.

The electronic system 710 may be understood as a mobile system, a personal computer, a computer for an industrial use or a logic system which performs various functions. For example, the mobile system may be any one among a personal digital assistant (PDA), a portable computer, a tablet computer, a mobile phone, a smart phone, a wireless phone, a laptop computer, a memory card, a digital music system and an information transmission/reception system.

If the electronic system 710 is a device capable of performing wireless communication, then the electronic system 710 may be used in a communication system such as CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Referring to FIG. 13, semiconductor devices in accordance with disclosed embodiments may be provided in the form of a memory card 800. For example, the memory card 800 may include a memory 810 such as a nonvolatile memory device and a memory controller 820. The memory 810 and the memory controller 820 may store data or read stored data.

The memory 810 may include at least any one of nonvolatile memory devices to which the semiconductor devices in accordance with embodiments are applied, and the memory controller 820 may control the memory 810 to read stored data or store data, in response to a read/write request from a host 830.

While various embodiments have been described above, it will be understood to those skilled in the art that the embodiments described are by way of example only. Accordingly, semiconductor devices with an extended bandwidth described herein should not be limited based on the described embodiments.

What is claimed is:

1. A metal option structure of a semiconductor device, comprising:
   a plurality of vias connecting first metal lines provided in a first metal layer to second metal lines provided in a second metal layer disposed over the first metal layer, and configured to constitute a plurality of nodes of an option circuit; and
   an identification pattern extending from the first metal layer to the second metal layers and having a different layout structure from the vias.

2. The metal option structure of claim 1, wherein the identification pattern comprises a plurality of via patterns.

3. The metal option structure of claim 1, wherein the identification pattern comprises a dot-type via pattern and a line-typed via pattern.

4. The metal option structure of claim 2, wherein one end parts of the first metal lines are disposed adjacent to each other, and each one end part is connected to one of the plurality of via patterns.

5. The metal option structure of claim 4, wherein at least one of the plurality of via patterns is included in a routing path that connects at least two of the plurality of nodes.

6. The metal option structure of claim 5, further comprising an option via disposed between the first and second metal layers and connecting at least two of the plurality of via patterns in the routing path.

7. The metal option structure of claim 2, further comprising a coupling line provided in the first metal layer and connected to one of the plurality of via patterns.

8. The metal option structure of claim 7, further comprising an option via provided between the coupling line and one of the second metal lines to connect the coupling line and the one second metal line, and constitute a routing path connecting nodes selected among the nodes.

9. The metal option structure of claim 1, wherein the identification pattern comprises a via pattern that is electrically separated from the first metal lines and the second metal lines.

10. The metal option structure of claim 9, further comprising:
- a first dummy metal line disposed in the first metal layer; and
- a second dummy metal line disposed in the second metal layer and intersecting the first dummy metal line,
- wherein the via pattern is disposed at an intersection between the first dummy metal line and the second dummy metal line.

* * * * *